United States Patent
Nishimura et al.

(10) Patent No.: US 9,260,246 B2
(45) Date of Patent: Feb. 16, 2016

(54) GLASS SHEET CONVEYING APPARATUS AND GLASS SHEET CONVEYING METHOD

(71) Applicant: Nippon Electric Glass Co., Ltd., Shiga (JP)

(72) Inventors: Naoki Nishimura, Shiga (JP); Hirokazu Okumura, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 0 days.

(21) Appl. No.: 14/379,560

(22) PCT Filed: Jan. 29, 2013

(86) PCT No.: PCT/JP2013/051876
§ 371 (c)(1),
(2) Date: Aug. 19, 2014

(87) PCT Pub. No.: WO2013/125303
PCT Pub. Date: Aug. 29, 2013

(65) Prior Publication Data
US 2015/0068867 A1 Mar. 12, 2015

(30) Foreign Application Priority Data
Feb. 20, 2012 (JP) ................................. 2012-034086

(51) Int. Cl.
*B65G 47/22* (2006.01)
*B65G 15/14* (2006.01)
(Continued)

(52) U.S. Cl.
CPC . *B65G 15/14* (2013.01); *B08B 1/02* (2013.01); *B08B 3/022* (2013.01); *B65G 47/24* (2013.01);
(Continued)

(58) Field of Classification Search
CPC .. B65G 49/063; B65G 49/064; B65G 47/525; B65G 21/2072
USPC ................ 198/836.1, 836.2, 493; 406/86, 88; 65/25.1
See application file for complete search history.

(56) References Cited

U.S. PATENT DOCUMENTS 1,751,712 A * 3/1930 Owen ......................... 198/836.1
4,716,086 A * 12/1987 Gillery et al. .................. 428/630
(Continued)

FOREIGN PATENT DOCUMENTS

| CN | 1499299 | 5/2004 |
|----|---------|--------|
| CN | 101256943 | 9/2008 |

(Continued)

OTHER PUBLICATIONS

International Search Report issued May 7, 2013 in International (PCT) Application No. PCT/JP2013/051876.
(Continued)

*Primary Examiner* — James R Bidwell
(74) *Attorney, Agent, or Firm* — Wenderoth, Lind & Ponack, L.L.P.

(57) ABSTRACT

Provided is a glass sheet conveying apparatus, which is configured to convey a glass sheet (G) in a state of being placed on a plurality of conveying belts (1) arrayed in parallel, and to move, by pressing rollers (2) arranged on a conveying path, the glass sheet (G) in a width direction orthogonal to a conveying direction, to thereby position the glass sheet (G). The glass sheet conveying apparatus includes an auxiliary supporting portion (3) for supporting, when positioning the glass sheet (G), a part of the glass sheet (G) supported from the bottom by the plurality of conveying belts (1) through use of a liquid layer (8) from the bottom in an auxiliary manner to reduce moving resistance of the glass sheet (G) in the width direction.

9 Claims, 8 Drawing Sheets

(51) Int. Cl.
  *H01L 21/677* (2006.01)
  *B65G 49/06* (2006.01)
  *B08B 1/02* (2006.01)
  *B08B 3/02* (2006.01)
  *B65G 47/24* (2006.01)

(52) U.S. Cl.
  CPC ............ *B65G 49/064* (2013.01); *B65G 49/065* (2013.01); *H01L 21/67706* (2013.01); *H01L 21/67784* (2013.01)

(56) References Cited

U.S. PATENT DOCUMENTS

| | | | | |
|---|---|---|---|---|
| 5,027,941 | A * | 7/1991 | Lenhardt | 198/836.3 |
| 5,311,979 | A * | 5/1994 | Risley et al. | 198/836.1 |
| 6,245,145 | B1 * | 6/2001 | Lisec | 198/836.2 |
| 6,296,029 | B1 * | 10/2001 | Grivna | 198/836.2 |
| 7,905,195 | B2 * | 3/2011 | Yamasaki et al. | 406/88 |
| 2006/0054774 | A1 * | 3/2006 | Yassour et al. | 248/631 |
| 2013/0040541 | A1 * | 2/2013 | Mader et al. | 198/836.2 |

FOREIGN PATENT DOCUMENTS

| | | |
|---|---|---|
| CN | 101407284 | 4/2009 |
| CN | 102190435 | 9/2011 |
| JP | 9-169427 | 6/1997 |
| JP | 2000-193604 | 7/2000 |
| JP | 2002-347922 | 12/2002 |
| JP | 2003-300618 | 10/2003 |
| JP | 2006-247768 | 9/2006 |
| JP | 2007-51029 | 3/2007 |
| JP | 2007-99553 | 4/2007 |
| JP | 2008-166359 | 7/2008 |
| JP | 2008-273687 | 11/2008 |
| KR | 10-0422392 | 3/2004 |

OTHER PUBLICATIONS

International Preliminary Report on Patentability and Written Opinion of the International Searching Authority issued Aug. 26, 2014 in International (PCT) Application No. PCT/JP2013/051876.
Chinese Office Action issued Aug. 28, 2015 in corresponding Chinese Patent Application No. 201380009904.4 with English translation.

* cited by examiner

GLASS SHEET CONVEYING APPARATUS AND GLASS SHEET CONVEYING METHOD

TECHNICAL FIELD

The present invention relates to an improvement of a conveying technology for positioning a glass sheet on a conveying path prior to an end-surface process of the glass sheet.

BACKGROUND ART

As is well known, various glass sheets such as glass substrates for flat panel displays (FPD) including a liquid crystal display and an OLED display may be conveyed at high speed while being placed on a plurality of conveying belts that are arrayed in parallel at intervals (see, for example, Patent Literatures 1 and 2).

On a conveying path, an end-surface process such as grinding is performed on both edges of a glass sheet in a width direction that is orthogonal to a conveying direction. In this case, in order to ensure process accuracy, prior to the end-surface process, it is necessary to accurately position the glass sheet on the conveying belts. At the time of the positioning, in general, the glass sheet is moved on the conveying belts in the direction that is orthogonal to the conveying direction, and the position and the direction of the glass sheet with respect to the conveying belts are adjusted.

CITATION LIST

Patent Literature 1: JP 2007-51029 A
Patent Literature 2: JP 2006-247768 A

SUMMARY OF INVENTION

Technical Problem

By the way, in recent years, thinning of the glass sheet has been promoted, and along with the thinning, in actuality, the glass sheet is liable to be deformed.

However, as illustrated in FIG. 11, when a thinned glass sheet G is supported on a plurality of conveying belts 1, a part of the glass sheet G that is not supported by the conveying belts 1 may be deflected downward. When the glass sheet is to be positioned on the conveying belts as it is, the deflection of the glass sheet becomes significant resistance to the movement of the glass sheet in the width direction, and hence there is a problem in that the glass sheet cannot be smoothly positioned.

The present invention has been made in view of the above-mentioned circumstances, and it is therefore a technical object thereof to smoothly position a glass sheet on a plurality of conveying belts even when the glass sheet is thinned.

Solution to Problem

According to one embodiment of the present invention, which is devised to achieve the above-mentioned object, the present invention has a feature in a glass sheet conveying apparatus, which is configured to convey a glass sheet in a state of being placed on a plurality of conveying belts arrayed in parallel, and to move, by positioning means arranged on a conveying path, the glass sheet in a width direction orthogonal to a conveying direction, to thereby position the glass sheet, the glass sheet conveying apparatus comprising an auxiliary supporting portion for supporting, when positioning the glass sheet, a part of the glass sheet supported by the plurality of conveying belts through use of a fluid or an elastic member in an auxiliary manner to reduce moving resistance of the glass sheet in the width direction.

According to this structure, through the auxiliary support by the auxiliary supporting portion using the fluid or the elastic member, the moving resistance of the glass sheet in the width direction is reduced. Therefore, even if the glass sheet is thinned, the glass sheet can be smoothly moved in the width direction by the positioning means, and hence positioning work can be easily performed.

In the above-mentioned structure, it is preferred that a supply amount of the fluid from the auxiliary supporting portion become smaller at a time of the conveyance of the glass sheet than the supply amount at a time of the positioning of the glass sheet.

With this structure, the glass sheet can be reliably conveyed by reducing, at the time of the positioning of the glass sheet, the moving resistance between the glass sheet and the plurality of conveying belts and applying, at the time of the conveyance of the glass sheet, appropriate frictional force to the glass sheet and the plurality of conveying belts.

In the above-mentioned structure, the auxiliary supporting portion may have a support surface having a liquid layer (included in the fluid) formed thereon through supply of liquid, and the auxiliary supporting portion may support the glass sheet through an intermediation of the liquid layer.

With this structure, the glass sheet is supported by the liquid layer in a floating manner, and when the glass sheet is moved in the width direction at the time of the positioning of the glass sheet, a situation that the glass sheet is rubbed with the auxiliary supporting portion to be flawed can be prevented. Further, by sequentially renewing the liquid layer through circulation of the liquid, particles such as glass dust can be prevented from adhering onto the glass sheet or the glass sheet can be prevented from being scratched by the particles.

In the above-mentioned structure, the auxiliary supporting portion may comprise a brush-shaped portion (included in the elastic member) formed of a plurality of linear members, and the auxiliary supporting portion may support the glass sheet through use of elasticity of the brush-shaped portion.

With this structure, the moving resistance of the glass sheet in the width direction at the time of the positioning of the glass sheet can be reduced with the simplified structure.

In the above-mentioned structure, it is preferred that the brush-shaped portion comprise a rotary shaft extending in the width direction, and that the brush-shaped portion be rotatable along with the conveyance of the glass sheet.

With this structure, the support surface that supports the glass sheet in an auxiliary manner is sequentially renewed through the rotation of the brush-shaped portion, and hence the particles such as the glass dust can be prevented from adhering onto the glass sheet or the glass sheet can be prevented from being scratched by the particles.

In the above-mentioned structure, it is preferred that a lower part of the brush-shaped portion be automatically cleaned.

With this structure, along with the rotation of the brush-shaped portion, the entire circumference of the brush-shaped portion is automatically cleaned, and hence the adhesion of the particles onto the glass sheet or the like can be more reliably prevented.

In this case, as a method of automatically cleaning the lower part of the brush-shaped portion, for example, a method involving immersing the lower part of the brush-shaped portion into a cleaning liquid bath in which cleaning liquid is stored may be applied. However, in this case, depending on a mode of circulating the cleaning liquid, the particles removed by the cleaning may deposit on a bottom portion of the bath to degrade the cleaning performance. Therefore, as the method of automatically cleaning the lower part of the brush-shaped portion, for example, it is more preferred to employ a structure of directly jetting the cleaning liquid onto the lower part of the brush-shaped portion from a cleaning liquid jetting portion such as a nozzle. With this structure, a situation that the particles removed by the cleaning liquid are mixed into the cleaning liquid to be used for the cleaning can be avoided to enhance the cleaning performance.

In the above-mentioned structure, it is preferred that the auxiliary supporting portion be provided on each of both sides of each of the plurality of conveying belts in the width direction.

With this structure, downward deflection of the glass sheet can be more reliably suppressed, and the positioning can be performed more smoothly.

According to one embodiment of the present invention, which is devised to achieve the above-mentioned object, the present invention has a feature in a glass sheet conveying method for conveying a glass sheet in a state of being placed on a plurality of conveying belts arrayed in parallel, and moving, by positioning means arranged on a conveying path, the glass sheet in a width direction orthogonal to a conveying direction, to thereby position the glass sheet, the glass sheet conveying method comprising supporting, when positioning the glass sheet, a part of the glass sheet supported by the plurality of conveying belts through use of a fluid or an elastic member in an auxiliary manner to reduce moving resistance of the glass sheet in the width direction.

According to such a method, the same function and advantage as those of the above-mentioned corresponding structure can be obtained.

Advantageous Effects of Invention

As described above, according to one embodiment of the present invention, at the time of the positioning of the glass sheet, a part of the glass sheet supported by the plurality of conveying belts is supported through the use of the fluid or the elastic member in an auxiliary manner, and hence the moving resistance of the glass sheet in the width direction is reduced. Thus, even when the glass sheet is thinned, the glass sheet can be smoothly positioned on the plurality of conveying belts.

DESCRIPTION OF EMBODIMENTS

Now, embodiments of the present invention are described with reference to the attached drawings.

First Embodiment

Figure 1:
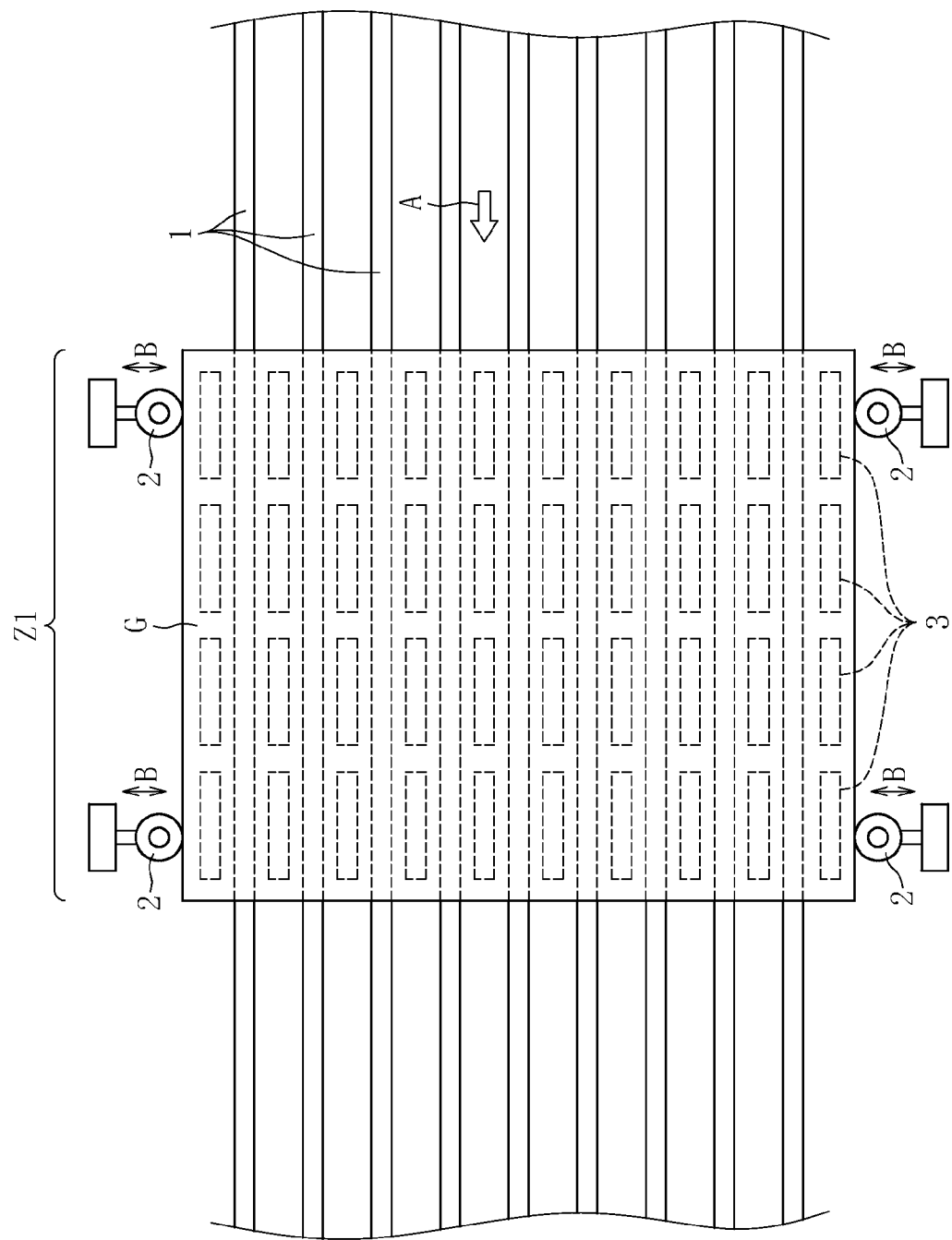
FIG. 1 is a plan view illustrating a glass sheet conveying apparatus according to a first embodiment of the present invention.

FIG. 1 is a plan view illustrating a glass sheet conveying apparatus according to a first embodiment of the present invention. The conveying apparatus has a structure in which a plurality of conveying belts 1 that are parallel to a conveying direction (arrow A direction in FIG. 1; note that, the arrow A in the other drawings also denotes the conveying direction) are arrayed in parallel at intervals in a width direction that is orthogonal to the conveying direction (hereinafter referred to simply as "width direction").

The conveying belts 1 are each constructed by an endless belt, and are driven in synchronization with each other through use of a servomotor or a rotary shaft in common. Note that, a width of each of the conveying belts 1 and an array pitch thereof may be changed as appropriate depending on deflection of a glass sheet G.

In this case, a thickness of the glass sheet G to be conveyed is, for example, 0.3 to 0.7 mm, and a size on one edge thereof is, for example, 1,500 mm or more.

On a conveying path of the conveying belts 1, a positioning region Z1 for positioning the glass sheet G placed on the conveying belts 1 is provided. In the positioning region Z1, pressing rollers 2 that function as positioning means are arranged on both sides of the conveying path of the glass sheet G. Each of the pressing rollers 2 can be advanced and retreated in the arrow B direction (width direction) in FIG. 1, and is brought into abutment against both lateral edges of the conveyed glass sheet G, which are opposed to each other in the width direction, to thereby position the glass sheet G.

In the positioning region Z1, auxiliary supporting portions 3 for supporting the glass sheet G supported by the conveying belts 1 in an auxiliary manner are further provided. Note that, in the example of FIG. 1, a plurality of the auxiliary supporting portions 3 are arrayed between the adjacent conveying belts 1 and between the conveying belt 1 and the pressing rollers 2 on each of both edge portions in the width direction.

Figure 2:
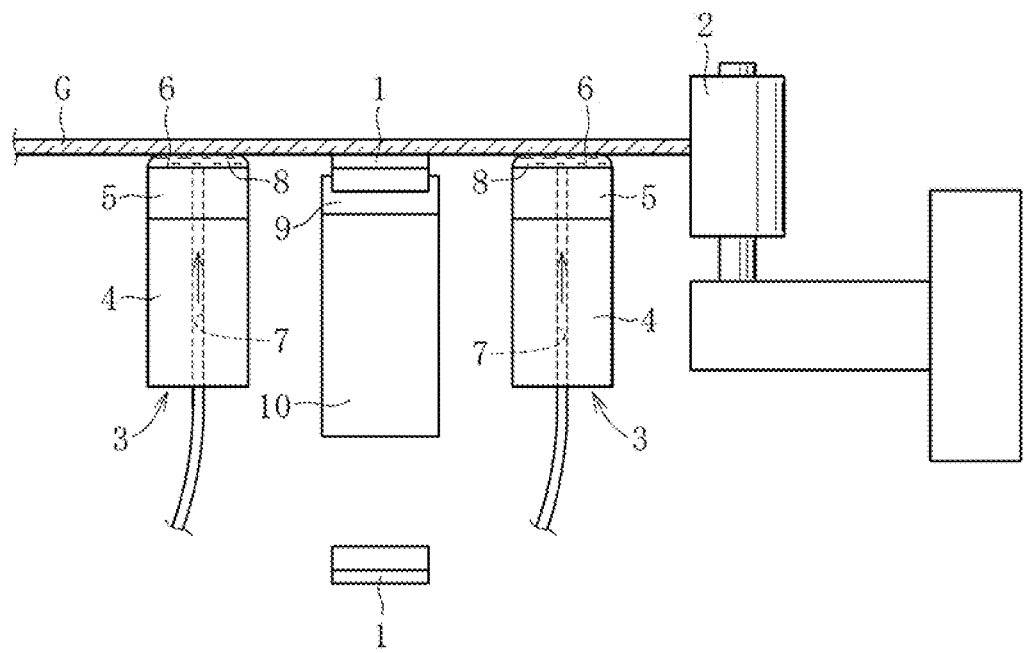
FIG. 2 is a vertical cross-sectional view in a width direction, for illustrating the glass sheet conveying apparatus according to the first embodiment.

Specifically, as illustrated in FIG. 2, the auxiliary supporting portion 3 comprises a base member 4 made of a metal or the like and a support block 5 made of a resin or the like, which is integrated with the base member 4. A liquid jetting hole 7 for jetting liquid as a fluid (for example, water) is opened at a support surface 6 formed on an upper surface of the support block 5. The liquid jetted from the liquid jetting hole 7 forms a liquid layer 8 on the support surface 6, and a part of the glass sheet G is supported by the liquid layer 8 in a floating manner. In this case, the liquid of the liquid layer 8 is sequentially renewed through supply of the liquid from the liquid jetting hole 7. Note that, in FIG. 2, reference symbol 9 denotes a belt guide and reference symbol 10 denotes a belt frame.

Figure 3:
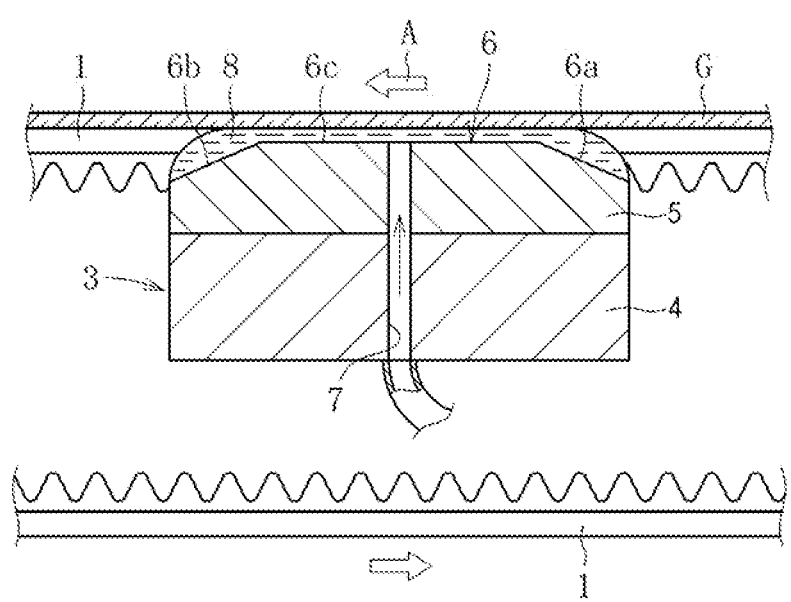
FIG. 3 is a vertical cross-sectional view in a conveying direction, for illustrating the glass sheet conveying apparatus according to the first embodiment.

As illustrated in FIG. 3, the support surface 6 has a first tapered surface 6a located on an upstream side in the conveying direction, a second tapered surface 6b located on a downstream side in the conveying direction, and a horizontal surface 6c located between the first tapered surface 6a and the second tapered surface 6b. The first tapered surface 6a is provided so as to prevent, when deflection of the glass sheet G is significant, the glass sheet G from being brought into direct contact with the support surface 6. Note that, the support surface 6 may have the first tapered surface 6a and the horizontal surface 6c with the second tapered surface 6b omitted, or may have only the horizontal surface 6c with the tapered surfaces 6a and 6b omitted. Further, it is preferred that the horizontal surface 6c of the support surface 6 be arranged slightly lower in height than an upper surface of the conveying belt 1.

Figure 4:
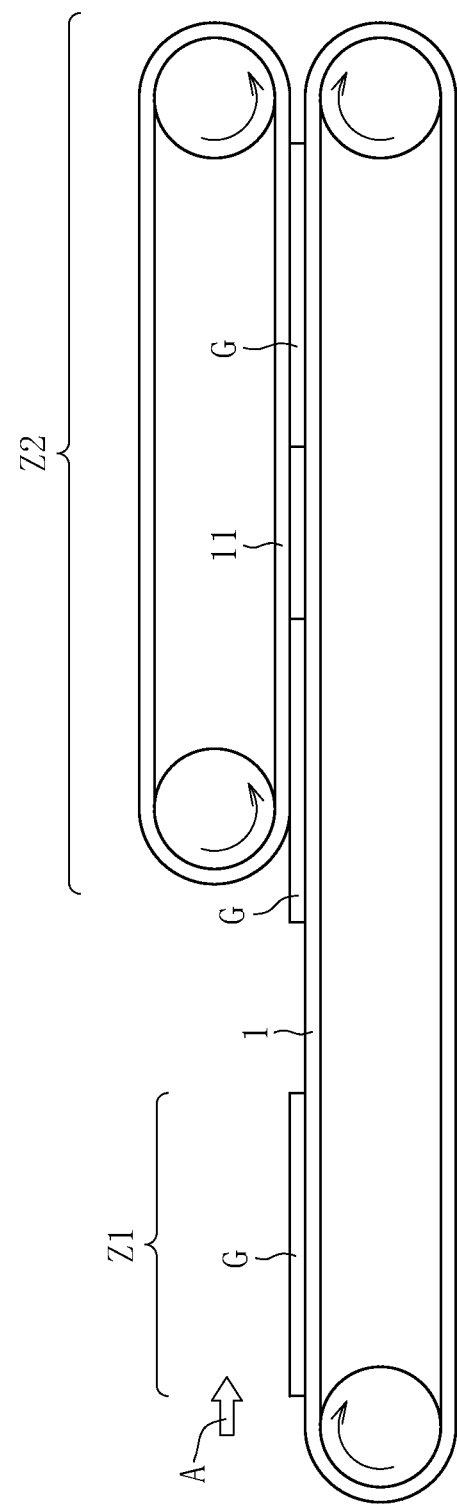
FIG. 4 is a side view illustrating a positioning region and a processing region of the glass sheet conveying apparatus according to the first embodiment.
Figure 5:
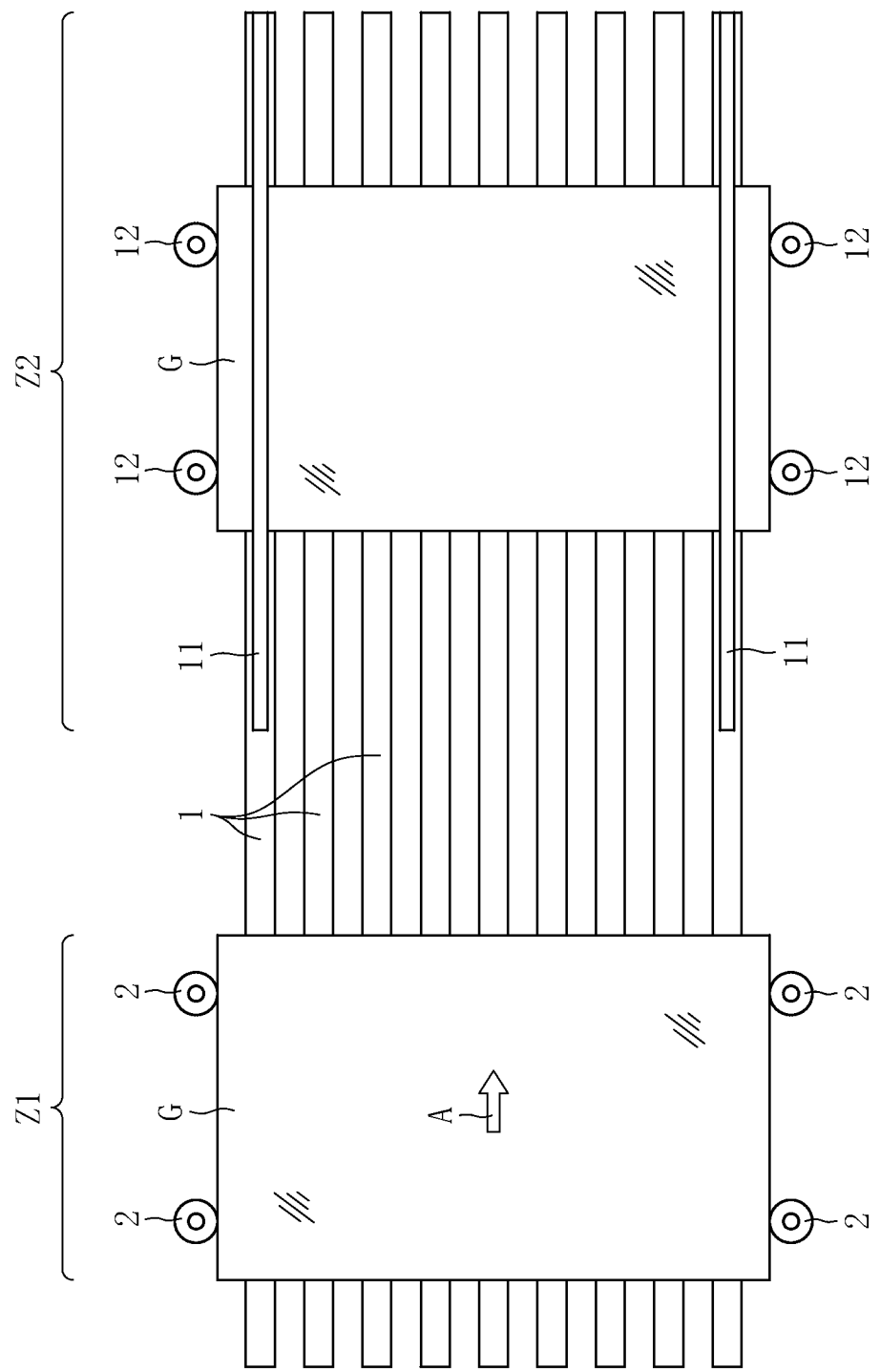
FIG. 5 is a plan view illustrating the positioning region and the processing region of the glass sheet conveying apparatus according to the first embodiment.

In this embodiment, as illustrated in FIG. 4, in a processing region Z2 adjacent to a downstream side of the positioning region Z1, a pair of auxiliary belts 11 for nipping the glass sheet G with the conveying belts 1 to convey the glass sheet G are arrayed in parallel. Further, as illustrated in FIG. 5, on both sides of a part of the conveying path of the glass sheet G in a region in which the conveying belts 1 and the auxiliary belts 11 are overlapped, grinding tools 12 as rotary grinding wheels for performing a grinding process or a corner-cutting process on both the lateral edges of the glass sheet G nipped by the conveying belts 1 and auxiliary belts 11 are arranged, respectively.

Next, an operation of the glass sheet conveying apparatus constructed as described above is described.

First, as illustrated in FIG. 1, the glass sheet G is placed on the conveying belts 1 in a horizontal posture. Then, the glass sheet G is conveyed in the arrow A direction along with drive of the conveying belts 1, for example, at a conveying speed of 60 to 180 m/min. When the glass sheet G is conveyed to the positioning region Z1 on the conveying path, the glass sheet G is temporarily stopped or sufficiently decelerated (for example, decelerated to a speed of about 1/10 of the conveying speed), and the pressing rollers 2 provided on both sides of the glass sheet G in the width direction are brought into abutment against both the lateral edges of the glass sheet G, to thereby position the glass sheet G. At the time of the positioning, the glass sheet G is supported by the auxiliary supporting portions 3 in an auxiliary manner.

Specifically, as illustrated in FIGS. 2 and 3, a part of the glass sheet G is supported in a floating manner by the liquid layer 8 formed on the support surface 6 of the auxiliary supporting portion 3. Thus, deflection of the glass sheet G that occurs in a region that is not supported by the conveying belts 1, such as a region between the adjacent conveying belts 1, can be restricted, and hence moving resistance (frictional resistance) of the glass sheet G in the width direction can be reduced. Therefore, the glass sheet G can be smoothly positioned by the pressing rollers 2. Further, with a protection effect by the liquid layer 8, a situation that the glass sheet G is brought into direct contact with the support surface 6 to be scratched can be effectively suppressed.

Then, after the completion of the positioning of the glass sheet G as described above, supply of the liquid by the auxiliary supporting portions 3 is stopped or decreased, and the glass sheet G is conveyed to the processing region Z2 on the downstream side. That is, on the conveying belts 1, the glass sheet G is returned to a state of being difficult to move, and thus the glass sheet G can be accelerated or decelerated in a short period of time to increase the entire conveying speed.

The glass sheet G conveyed to the processing region Z2 is nipped by the conveying belts 1 and the auxiliary belts 11 to be subjected to an end-surface process by the grinding tools 12.

Note that, in this embodiment, the glass sheet G is nipped by the conveying belts 1 and the auxiliary belts 11 so that a posture of the positioned glass sheet G is maintained. However, the auxiliary belts 11 may be omitted, and the glass sheet G may be sucked and held on the conveying belts 1 in the processing region Z2.

Further, the case where the glass sheet G is supported using the liquid layer 8 in an auxiliary manner is described. However, instead of being provided in a form of a layer, the liquid may be directly jetted onto the glass sheet G so that the glass sheet G is supported by the jetting pressure. In this case, a gas (for example, air) may be jetted instead of the liquid.

Second Embodiment

Figure 6:
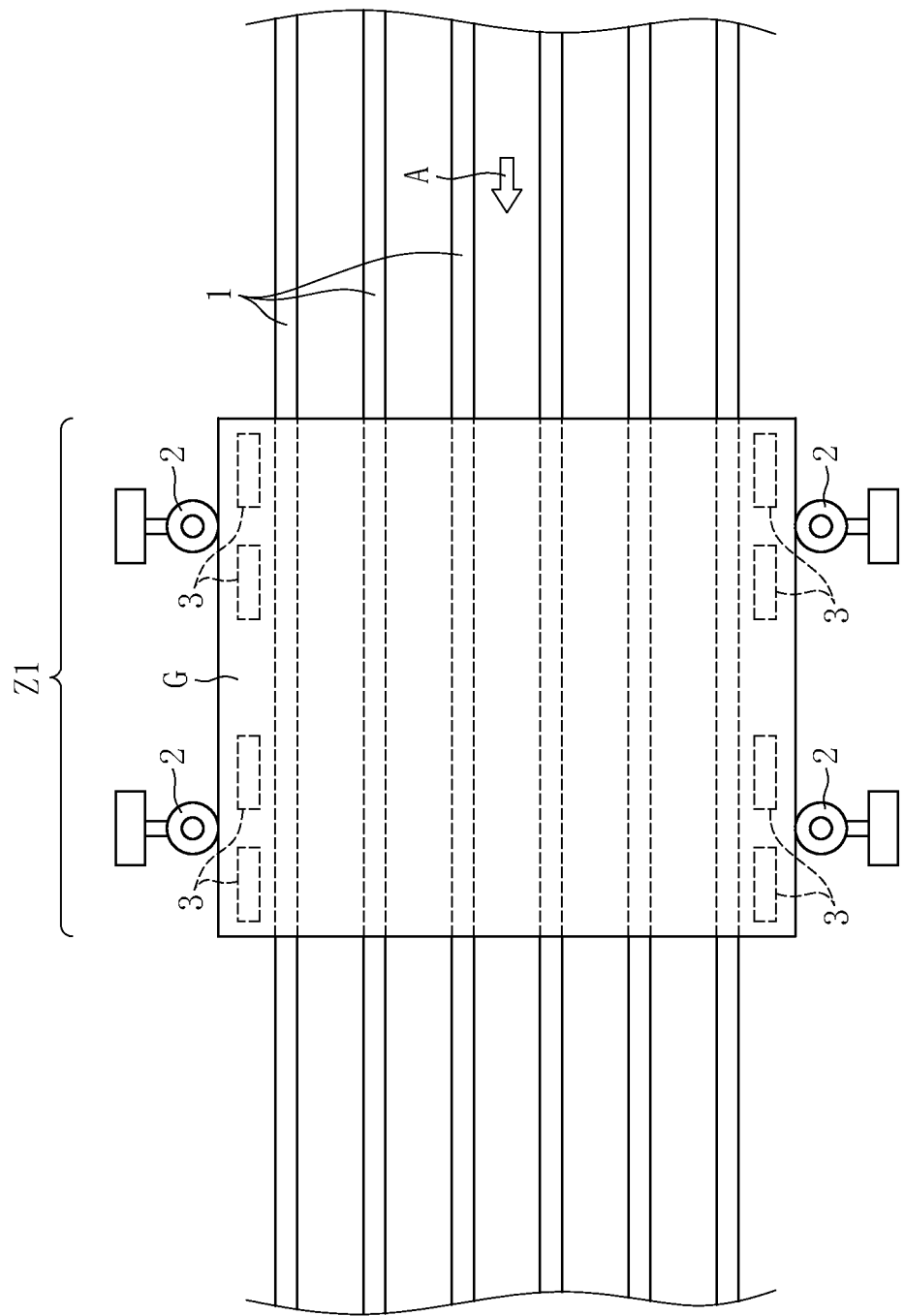
FIG. 6 is a plan view illustrating a glass sheet conveying apparatus according to a second embodiment of the present invention.

FIG. 6 is a plan view illustrating a glass sheet conveying apparatus according to a second embodiment of the present invention. The conveying apparatus according to the second embodiment is different from the conveying apparatus according to the first embodiment in that the auxiliary supporting portions 3 are arranged only between the conveying belts 1 located on both the edge portions in the width direction and the pressing rollers 2. That is, when the glass sheet G is relatively small in size (for example, a dimension on one edge is 1,500 mm or less), deflection of the glass sheet G in a region in which the conveying belts 1 are not provided is reduced, and hence the number of the auxiliary supporting portions 3 to be arranged can be reduced as appropriate. Further, similarly, also when the thickness of the glass sheet G is relatively large (for example, in a case of a thickness of 0.5 mm or more), the deflection of the glass sheet G is reduced, and hence the number of the auxiliary supporting portions 3 to be arranged can be reduced. In other words, the mode of arrangement of the auxiliary supporting portions 3 may be changed as appropriate depending on the size or the thickness of the glass sheet G.

Third Embodiment

Figure 7:
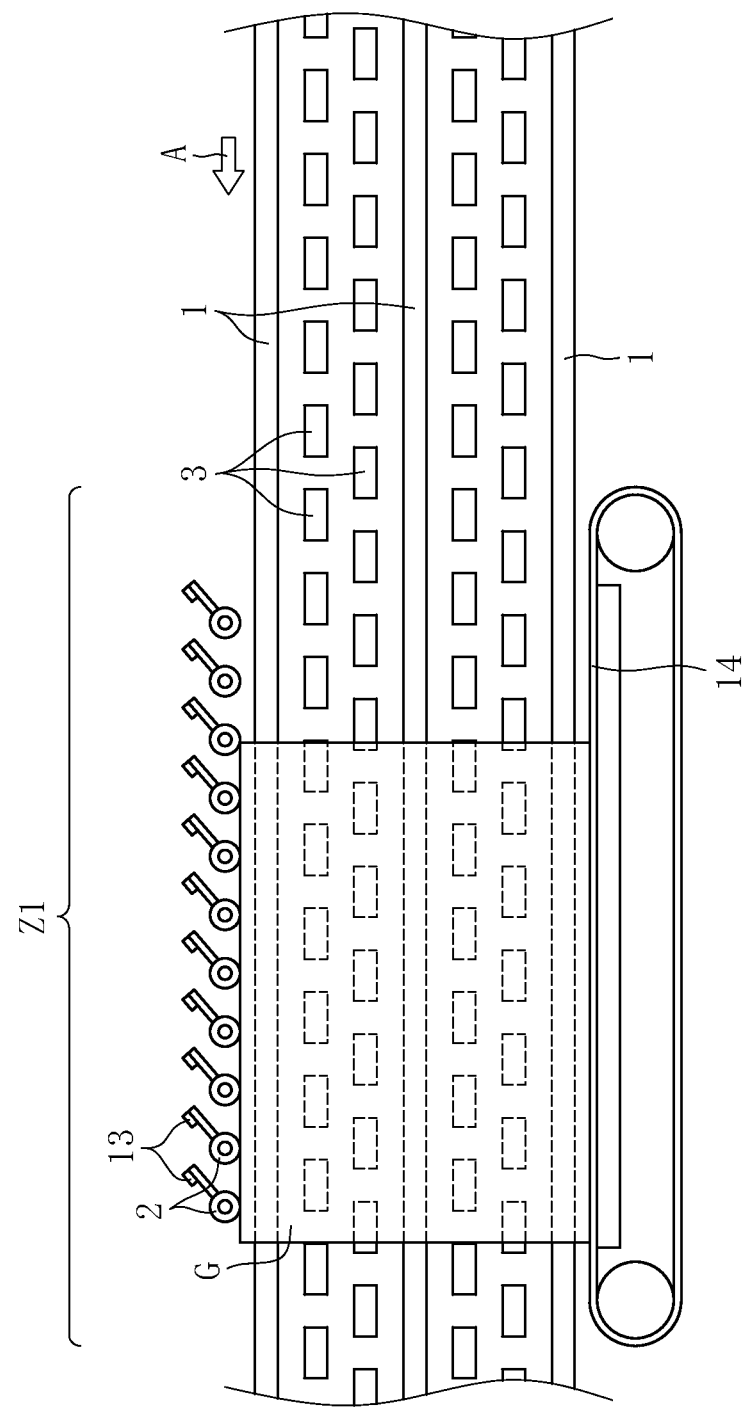
FIG. 7 is a plan view illustrating a glass sheet conveying apparatus according to a third embodiment of the present invention.

FIG. 7 is a plan view illustrating a glass sheet conveying apparatus according to a third embodiment of the present invention. The conveying apparatus according to the third embodiment is different from the conveying apparatus according to the first and second embodiments in that the glass sheet G is positioned while being conveyed.

Specifically, on one side of the conveying path corresponding to the positioning region Z1, a plurality of the pressing rollers 2, which are biased toward the center in the width direction by elastic members 13 such as leaf springs, are arranged along the conveying direction. Further, on the other side of the conveying path corresponding to the positioning region Z1, a reference belt 14 that is long in the conveying direction is arranged so as to be opposed to the pressing rollers 2. The reference belt 14 is constructed by an endless belt so as not to hinder the conveyance of the glass sheet G, and is driven to rotate at the same speed as the conveying speed of the glass sheet G or is rotated along with the movement of the glass sheet G.

In the positioning region Z1, the glass sheet G is successively conveyed while maintaining a predetermined conveying speed (for example, 4 to 25 m/min) without decelerating the glass sheet G, and the glass sheet G is sequentially pressed toward the reference belt 14 by the pressing rollers 2, to thereby position the glass sheet G.

Note that, in this embodiment, in a region between the adjacent conveying belts 1, a plurality of rows (two rows in FIG. 7) of the auxiliary supporting portions 3 are arranged. Further, when the glass sheet G is successively conveyed in the positioning region Z1 while maintaining the predetermined conveying speed without decelerating the glass sheet G, a supply amount of the liquid from the auxiliary supporting portions 3 may be constant also after the completion of the positioning. This is because the glass sheet G is conveyed at relatively low speed without accelerating or decelerating the glass sheet G, and hence a risk of positional misalignment of the glass sheet G on the conveying belts 1 after passing through the positioning region Z1 is low. In this case, equipment for changing the supply amount of the liquid can be simplified.

Fourth Embodiment

Figure 8:
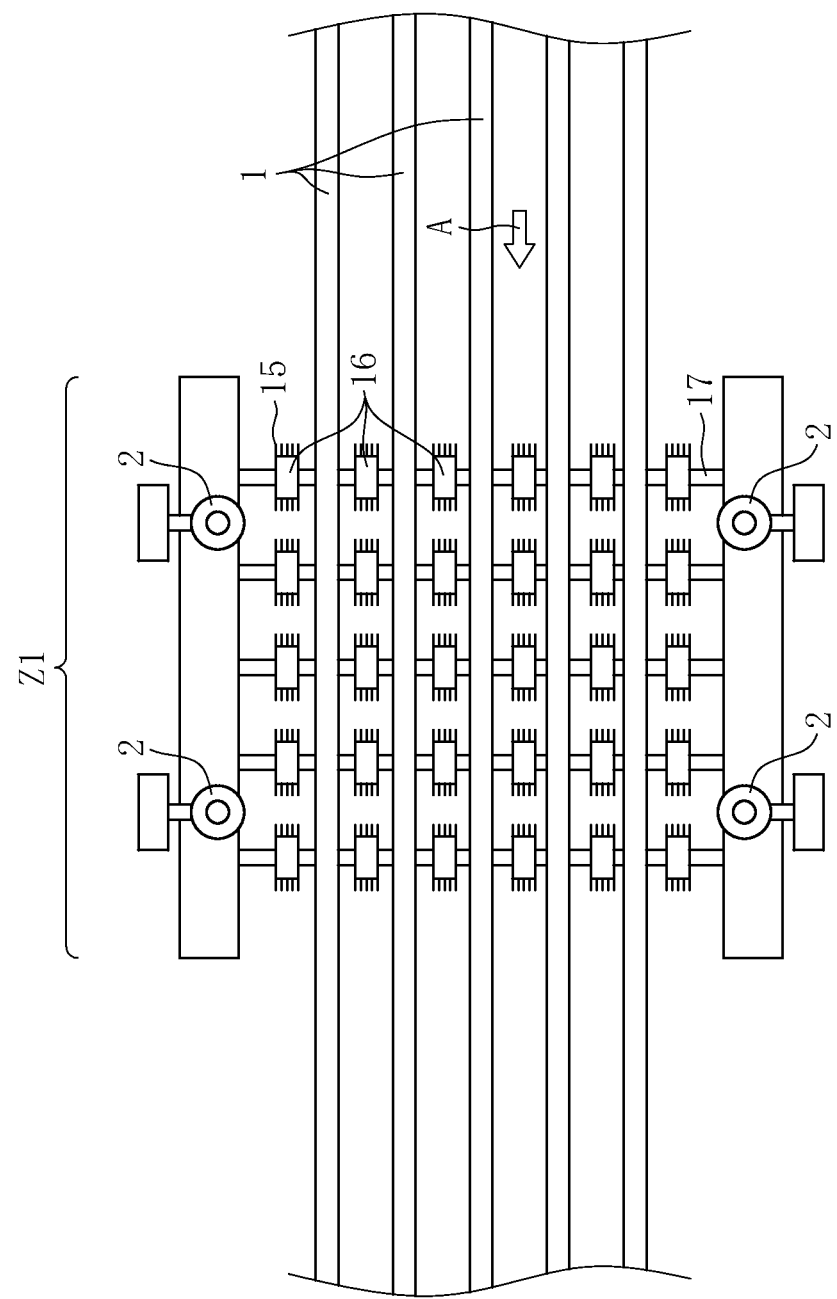
FIG. 8 is a plan view illustrating a glass sheet conveying apparatus according to a fourth embodiment of the present invention.

FIG. 8 is a plan view illustrating a glass sheet conveying apparatus according to a fourth embodiment of the present invention. The conveying apparatus according to the fourth embodiment is different from the conveying apparatus according to the first to third embodiments in that the auxiliary supporting portions are constructed by rotary brushes 16 formed of a plurality of linear members 15 as the elastic members.

Specifically, each of the rotary brushes 16 is axially supported by a rotary shaft 17 that is orthogonal to the conveying direction, and is rotated along with the conveyance of the glass sheet G. The rotary brushes 16 support the glass sheet G supported by the conveying belts 1 in an auxiliary manner through the use of elasticity of the linear members 15. Note that, it is preferred that the rotary brushes 16 be arranged so that upper ends thereof be at the height approximately in the same horizontal plane as the upper surfaces of the conveying belts 1.

The linear members 15 have elasticity to such an extent that, when the glass sheet G is supported in an auxiliary manner, tips thereof are bent due to the weight of the glass sheet G. For example, a member made of a resin (for example, a nylon-based resin) and having a small wire diameter (for example, 30 μm or less, preferably 20 μm or less) is used.

Figure 9:
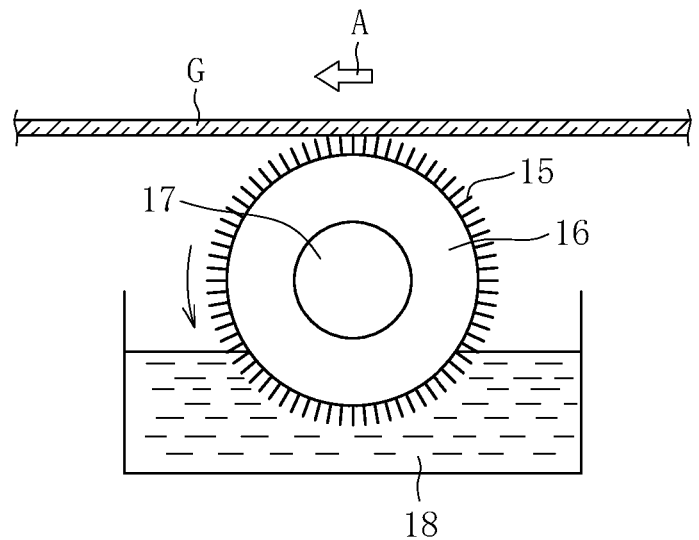
FIG. 9 is a vertical cross-sectional view in the conveying direction, for illustrating a rotary brush of the glass sheet conveying apparatus according to the fourth embodiment.

Further, as illustrated in FIG. 9, a lower part of each of the rotary brushes 16 is immersed into cleaning liquid 18, and along with the rotation of the rotary brushes 16, particles and the like adhering onto the linear members 15 are removed by the cleaning liquid 18. Thus, the glass sheet G supported by the rotary brushes 16 in an auxiliary manner can be prevented from being stained or scratched due to the particles.

Figure 10:
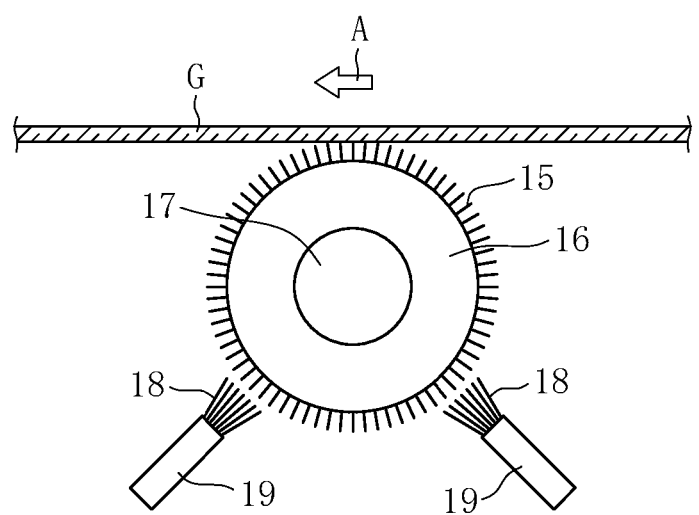
FIG. 10 is a vertical cross-sectional view in the conveying direction, for illustrating a modification of a cleaning method for the rotary brush illustrated in FIG. 9.
Figure 11:
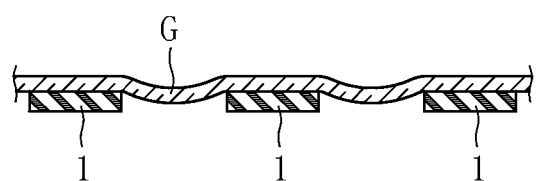
FIG. 11 is a view illustrating a problem inherent in a related art.

In this case, instead of immersing the rotary brushes 16 into the cleaning liquid, the rotary brushes 16 may be cleaned by, for example, as illustrated in FIG. 10, directly jetting the cleaning liquid 18 onto the lower part of each of the rotary brushes 16 from one or a plurality of cleaning liquid jetting nozzles 19 (or small holes perforated on the pipes). With this structure, the pure cleaning liquid 18 can be supplied easily from the cleaning liquid jetting nozzles 19 in a continuous manner, and hence the particles can be removed efficiently.

Note that, in this embodiment, the case where the auxiliary supporting portions are constructed by the rotary brushes is described. However, the auxiliary supporting portions may be constructed by planer brush-shaped members without the rotary structure (for example, artificial grass). Further, members other than the brush-shaped members may be applied as the auxiliary supporting portions as long as the members are low friction members having frictional resistance lower than the conveying belts 1.

REFERENCE SIGNS LIST 1 conveying belt
2 pressing roller
3 auxiliary supporting portion
6 support surface
6a first tapered surface
6b second tapered surface
6c horizontal surface
7 liquid jetting hole
8 liquid layer
11 auxiliary belt
12 grinding tool
13 elastic member
14 reference belt
15 linear member
16 rotary brush
18 cleaning liquid

The invention claimed is:

1. A glass sheet conveying apparatus, which is configured to convey a glass sheet in a state of being placed on a plurality of conveying belts arrayed in parallel, and to move, by positioning means arranged on a conveying path, the glass sheet in a width direction orthogonal to a conveying direction, to thereby position the glass sheet,
the glass sheet conveying apparatus comprising an auxiliary supporting portion for supporting, when positioning the glass sheet, a part of the glass sheet supported by the plurality of conveying belts through use of a liquid in an auxiliary manner to reduce moving resistance of the glass sheet in the width direction,
wherein a supply amount of the liquid from the auxiliary supporting portion is smaller at a time of the conveyance of the glass sheet than the supply amount at a time of the positioning of the glass sheet.

2. The glass sheet conveying apparatus according to claim 1, wherein the auxiliary supporting portion is provided on each of both sides of each of the plurality of conveying belts in the width direction.

3. The glass sheet conveying apparatus according to claim 1,
wherein the auxiliary supporting portion has a support surface having a liquid layer formed thereon through supply of the liquid, and
wherein the auxiliary supporting portion supports the glass sheet through an intermediation of the liquid layer.

4. A glass sheet conveying apparatus, which is configured to convey a glass sheet in a state of being placed on a plurality of conveying belts arrayed in parallel, and to move, by positioning means arranged on a conveying path, the glass sheet in a width direction orthogonal to a conveying direction, to thereby position the glass sheet,
the glass sheet conveying apparatus comprising an auxiliary supporting portion for supporting, when positioning the glass sheet, a part of the glass sheet supported by the plurality of conveying belts through use of an elastic member in an auxiliary manner to reduce moving resistance of the glass sheet in the width direction,
wherein the auxiliary supporting portion comprises a brush-shaped portion formed of a plurality of linear members, and wherein the auxiliary supporting portion supports the glass sheet through use of elasticity of the brush-shaped portion.

5. The glass sheet conveying apparatus according to claim 4, wherein the brush-shaped portion comprises a rotary shaft extending in the width direction, and
wherein the brush-shaped portion is rotatable along with the conveyance of the glass sheet.

6. The glass sheet conveying apparatus according to claim 5, wherein a lower part of the brush-shaped portion is automatically cleaned.

7. The glass sheet conveying apparatus according to claim 4, wherein the auxiliary supporting portion is provided on each of both sides of each of the plurality of conveying belts in the width direction.

8. A glass sheet conveying method for conveying a glass sheet in a state of being placed on a plurality of conveying belts arrayed in parallel, and moving, by positioning means arranged on a conveying path, the glass sheet in a width direction orthogonal to a conveying direction, to thereby position the glass sheet, the glass sheet conveying method comprising auxiliary supporting, when positioning the glass sheet, a part of the glass sheet supported by the plurality of conveying belts through use of a liquid in an auxiliary manner to reduce moving resistance of the glass sheet in the width direction,
wherein a supply amount of the liquid from the auxiliary supporting is smaller at a time of the conveyance of the glass sheet than the supply amount at a time of the positioning of the glass sheet.

9. A glass sheet conveying method for conveying a glass sheet in a state of being placed on a plurality of conveying belts arrayed in parallel, and moving, by positioning means arranged on a conveying path, the glass sheet in a width direction orthogonal to a conveying direction, to thereby position the glass sheet, the glass sheet conveying method comprising auxiliary supporting, when positioning the glass sheet, a part of the glass sheet supported by the plurality of conveying belts through use of an elastic member in an auxiliary manner to reduce moving resistance of the glass sheet in the width direction,
wherein the auxiliary supporting comprises auxiliary supporting using elasticity of a brush-shaped portion formed of a plurality of linear members.

* * * * *